(12) United States Patent
Morita et al.

(10) Patent No.: US 8,305,035 B2
(45) Date of Patent: Nov. 6, 2012

(54) ENERGY STORAGE DEVICE

(75) Inventors: Kazuki Morita, Osaka (JP); Yohsuke Mitani, Osaka (JP)

(73) Assignee: Panasonic Corporation, Osaka (JP)

( * ) Notice: Subject to any disclaimer, the term of this patent is extended or adjusted under 35 U.S.C. 154(b) by 292 days.

(21) Appl. No.: 12/860,957

(22) Filed: Aug. 23, 2010

(65) Prior Publication Data

US 2011/0115427 A1    May 19, 2011

(30) Foreign Application Priority Data

Nov. 13, 2009  (JP) .................. 2009-259632

(51) Int. Cl.
*H02J 7/00* (2006.01)

(52) U.S. Cl. ....................... 320/107; 320/132
(58) Field of Classification Search .................. 320/107
See application file for complete search history.

(56) References Cited

U.S. PATENT DOCUMENTS

| | | | | |
|---|---|---|---|---|
| 4,308,567 A | * | 12/1981 | Mark | .............. 361/187 |
| 4,633,168 A | * | 12/1986 | Venema | .............. 324/678 |
| 8,072,188 B2 | * | 12/2011 | Yorinobu et al. | .............. 320/141 |
| 2003/0057873 A1 | * | 3/2003 | Suzuki et al. | .............. 315/224 |
| 2004/0183560 A1 | * | 9/2004 | Savage et al. | .............. 324/765 |
| 2005/0077971 A1 | * | 4/2005 | Bashar | .............. 331/36 C |
| 2005/0111244 A1 | * | 5/2005 | Tzeng et al. | .............. 363/41 |

FOREIGN PATENT DOCUMENTS

JP    2007-57402 A    3/2007

* cited by examiner

*Primary Examiner* — Arun Williams
(74) *Attorney, Agent, or Firm* — RatnerPrestia

(57) ABSTRACT

In an energy storage device, a charging circuit is electrically coupled to the energy storage section. A first comparator is electrically coupled to an energy storage section, and its output is inverted when voltage Vc of the energy storage section reaches first predetermined voltage Vc1. A second comparator is electrically coupled to the energy storage section, and its output is inverted when voltage Vc of the energy storage section reaches second predetermined voltage Vc2. A control circuit is electrically coupled to the first comparator and the second comparator. The control circuit obtains period tm from inversion of the output of the first comparator to the output of the second comparator. Capacitance C of the energy storage section is calculated based on this period tm and voltage change width ΔVc between the first predetermined voltage Vc1 and the second predetermined voltage Vc2.

8 Claims, 9 Drawing Sheets

M. C. D. value: Marginal characteristic degradation value

M. C. D. value: Marginal characteristic degradation value

ENERGY STORAGE DEVICE

BACKGROUND OF THE INVENTION

1. Field of the Invention

The present invention relates to an energy storage device as a backup power supply for supplying power in its energy storage section to a load when voltage of a primary power supply reduces.

2. Background Art

A primary power supply, which is a DC power supply, is formed of a rectifier circuit for rectifying commercial AC power supply or a car battery. An energy storage device as a backup power supply includes an energy storage element such as a capacitor, and makes up for voltage reduction by supplying power stored in the energy storage element to a load when the voltage of the primary power supply reduces. The load can thus continue its operation. This type of energy storage device is used for covering a momentary voltage drop in the primary power supply or as an emergency power supply. If characteristics of the energy storage element are degraded, the energy storage device may not be able to supply sufficient power to the load at occurrence of voltage drop. Therefore, it is important to determine characteristic degradation in the energy storage element.

In general, if degradation in capacitor characteristics worsens, the storage capacity reduces, and thus capacitance becomes small. Accordingly, if a capacitor is used as the energy storage element, characteristic degradation can be determined by checking the capacitance.

Next, an example of method of measuring capacitance of capacitor is described with reference to FIG. 9. FIG. 9 is a schematic diagram of a capacitor performance (capacitance) measuring instrument. Measuring circuit 100 includes constant current source 110 and oscilloscope 120. Sample 200, which is a capacitor to find capacitance thereof, is connected to constant current source 110. In addition, oscilloscope 120 for monitoring the voltage of sample 200 is connected to both ends of sample 200.

Capacitance C of sample 200 is calculated as follows. If the current of constant current source 110 is I, and voltage of sample 200 that changes by charging during period t is V, the relationship of $C \cdot V = I \cdot t$ is established. Since capacitance C and current I are constant, $V = I \cdot t/C$ is established. Voltage V shows a linear correlation with respect to period t. Accordingly, if sample 200 is charged with constant current by constant current source 110, its voltage linearly changes by time. Using this character, oscilloscope 120 measures a change in voltage V against period t, so as to measure capacitance C based on $C = I \cdot t/V$. Alternatively, voltage V may be converted and measured in digital data by using an A/D converter, instead of oscilloscope 120.

Capacitance C of capacitor can be measured by using the above measuring instrument. However, it is not realistic to build in the measuring instrument including an oscilloscope to the energy storage device used as a backup power supply. A configuration of collecting digital data of voltage V by an A/D converter can be built in the energy storage device. However, accuracy may be insufficient depending on specifications of energy storage device. Reasons are given below.

In a configuration using an A/D converter instead of oscilloscope 120 in FIG. 9, variation of voltage V with time is measured up to the voltage lower (specifically, 0.3 V) than operating voltage of non-linear element in a circuit including the capacitor. Therefore, the A/D converter that can measure the voltage at least up to 0.3 V is sufficient.

On the other hand, if the A/D converter is a 10-bit A/D converter and a level shifter is also built-in, an assumed configuration is to capture voltage V at 10-bit resolution performance by amplifying input voltage ten times, for example, by the level shifter. In this case, the input voltage up to 5 V can be captured with about 4.9 mV ($5V/(2^{10}-1)$) at full scale. This resolution performance is called 1 LSB.

A general A/D converter has an error of about ±5 LSB, and thus an output error of the above A/D converter is about ±0.49% (±5 LSB×4.9 mV/5000 mV×100). This error achieves a sufficient accuracy as a performance measuring instrument for measuring capacitance C of capacitor.

On the other hand, if a load requiring backup power needs as high voltage as about 50V, for example, and the above general A/D converter is used for detecting high voltage, voltage V that can be captured is still up to 5V. Accordingly, voltage V needs to be input to the A/D converter after reducing one digit from a high-voltage value such as by applying resistive division. A captured voltage accuracy in this case becomes ±5 LSB×4.9 mV=±24.5 mV as described above. Therefore, a capture error is ten times, that is ±245 mV with respect to the high voltage (50V).

If voltage V is calculated under this capture error, an error in voltage V becomes as follows. Voltage V is a difference in absolute voltages at two points before and after period t. For example, if voltage V is 2V, absolute voltage values at two points whose difference is 2V, such as 48V to 50V, must be captured. An error at capturing 48V is, as described above, ±245 mV, and an error at capturing 50V is also ±245 mV. Therefore, an error of voltage V, which is a difference between these values, becomes ±490 mV at the maximum.

In other words, an error may become ±490 mV at the maximum relative to 2V, which is voltage V. In this case, the error reaches ±24.5% (±0.49 V/2V×100). Accordingly, if capacitance C is calculated using this voltage V, the error is large, and thus the determination accuracy of characteristic degradation is inadequate.

If voltage V is increased, the error becomes relatively small. However, period t becomes longer, which means more time is required for determining degradation by calculating capacitance C. Still more, one of absolute voltage values at two points needs to be a small value. If the voltage of primary power supply drops while charging from a low to high absolute voltage values, sufficient backup power many not be supplied.

To increase the measuring accuracy of capacitance C, for example, resolution performance (number of bits) of A/D converter may be increased. However, this makes circuit configuration more complicated.

SUMMARY OF THE INVENTION

An energy storage device of the present invention includes an energy storage section, a charging circuit, a first comparator, a second comparator, and control circuit. The charging circuit is electrically coupled to the energy storage section. The first comparator is electrically coupled to the energy storage section, and its output is inverted when voltage Vc of the energy storage section reaches first predetermined voltage Vc1. The second comparator is electrically coupled to the energy storage section, and its output is inverted when voltage Vc of the energy storage section reaches second predetermined voltage Vc2, which is greater than first predetermined voltage Vc1. The control circuit is electrically coupled to the charging circuit, the first comparator, and the second comparator. The control circuit obtains period tm from inversion of the output of the first comparator to inversion of the output of the second comparator when the energy storage section is charged with constant current Ics. Then, the control circuit calculates capacitance C of the energy storage section based on the period tm and voltage change width ΔVc between predetermined first voltage Vc1 and predetermined second voltage Vc2.

DETAILED DESCRIPTION OF THE INVENTION

First Exemplary Embodiment

Figure 1:
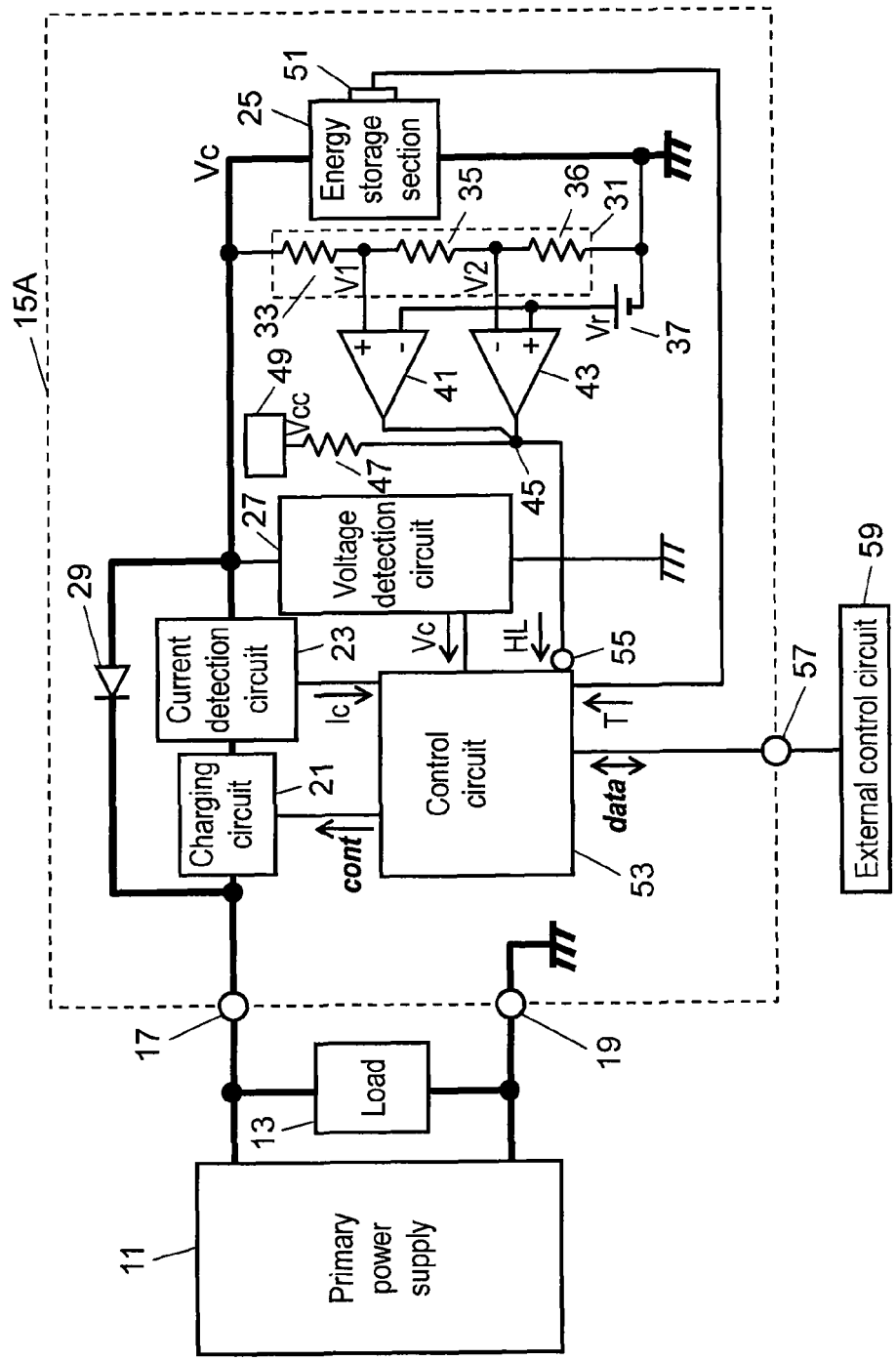
FIG. 1 is a block circuit diagram of an energy storage device in accordance with a first exemplary embodiment of the present invention.
Figure 2:
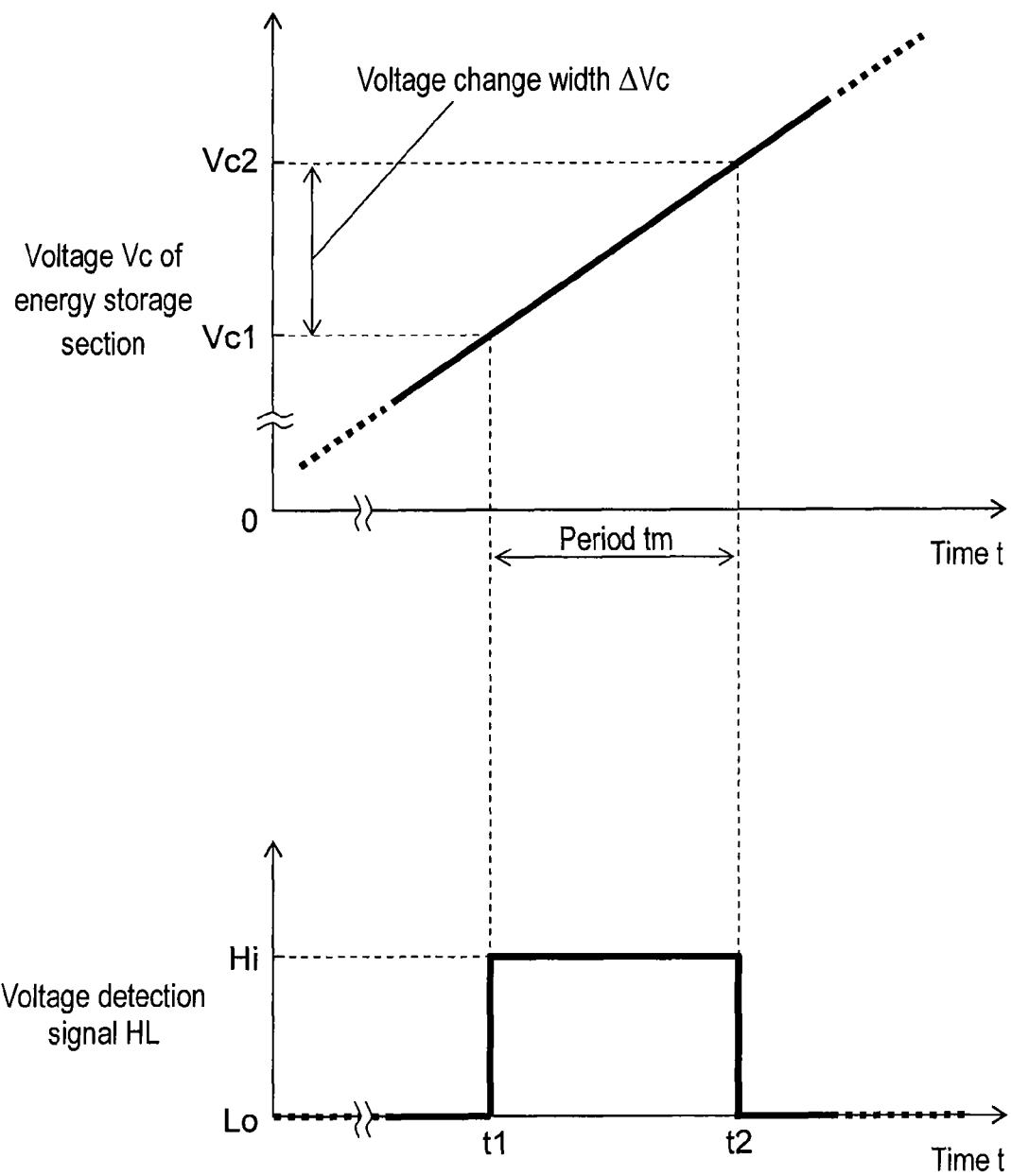
FIG. 2 is a time-dependent characteristics chart of voltage Vc of an energy storage section and voltage detection signal HL of the energy storage device in FIG. 1.
Figure 3:
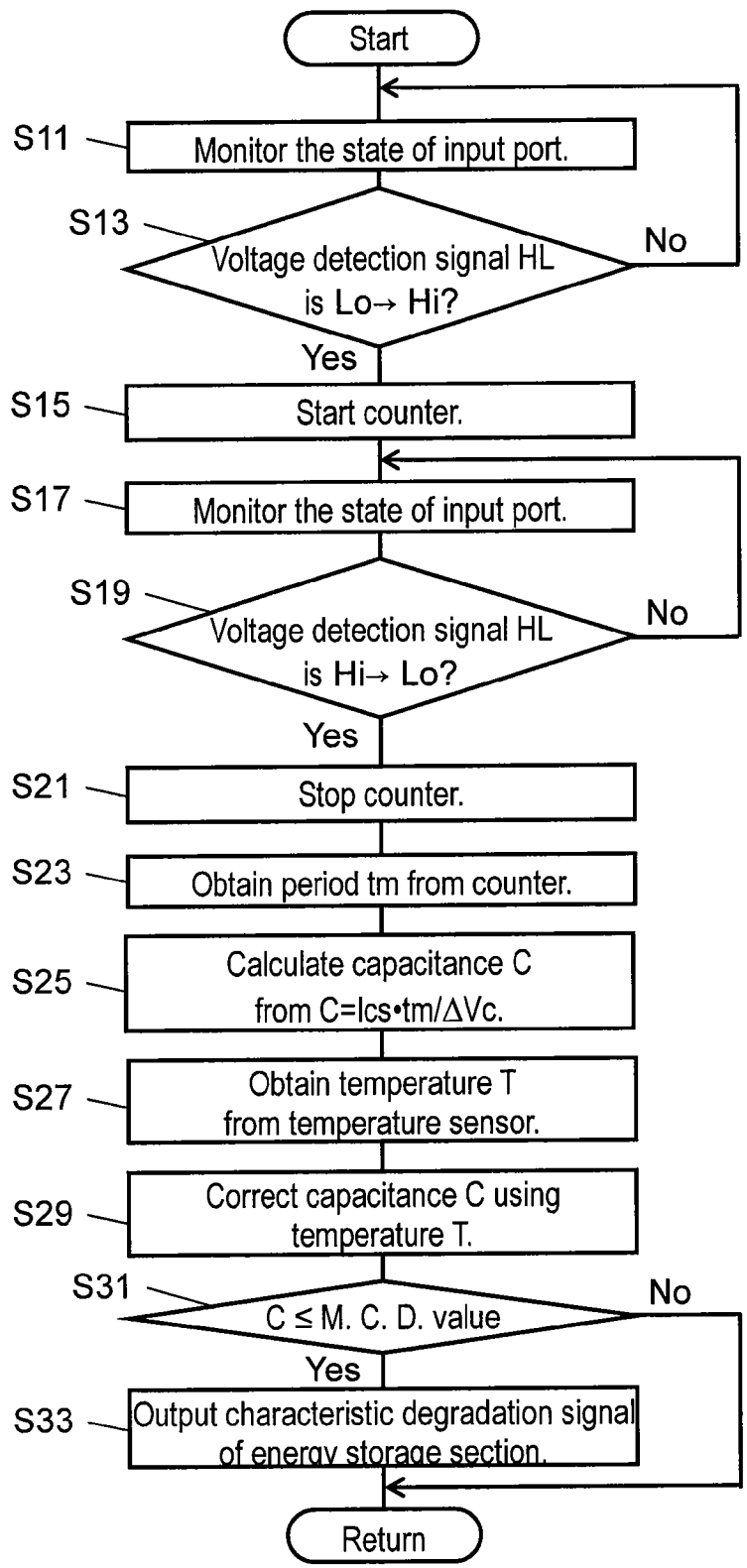
FIG. 3 is a flow chart of an operation for calculating capacitance of the energy storage section and determining characteristic degradation in the energy storage device in FIG. 1.

FIG. 1 is a block circuit diagram of an energy storage device in a first exemplary embodiment of the present invention. FIG. 2 is a time-dependent characteristics chart of voltage Vc of an energy storage section and voltage detection signal HL in the energy storage device shown in FIG. 1. FIG. 3 is a flow chart of an operation for calculating capacitance of the energy storage section and determining characteristic degradation in the energy storage device shown in FIG. 1. In FIG. 1, bold lines indicate power lines, and thin lines indicate signal lines.

As shown in FIG. 1, load 13 is connected in parallel to primary power supply 11, and energy storage device 15A is connected in parallel to load 13. Primary power supply 11 is a DC power source, and power is normally supplied from primary power supply 11 to load 13. When voltage of primary power supply 11 momentarily drops, power is supplied from energy storage device 15A to load 13, so as to continuously drive load 13.

Energy storage device 15A includes energy storage section 25, charging circuit 21, first comparator 41, second comparator 43, and control circuit 53. Charging circuit 21 is electrically coupled to energy storage section 25. First comparator 41 is electrically coupled to energy storage section 25, and its output is inverted when voltage Vc of energy storage section 25 reaches first predetermined voltage Vc1. Second comparator 43 is also electrically coupled to energy storage section 25, and its output is inverted when voltage Vc of energy storage section 25 reaches second predetermined voltage Vc2, which is greater than first predetermined voltage Vc1. Control circuit 53 is electrically coupled to charging circuit 21, first comparator 41, and second comparator 43.

Next, configuration including other components is detailed. Energy storage device 15A is electrically coupled to load 13 via positive terminal 17 and ground terminal 19. Ground terminal 19 is electrically coupled such that it is in common with a ground inside energy storage device 15A.

On the other hand, energy storage section 25 that stores power is electrically coupled to positive terminal 17 via charging circuit 21 and current detection circuit 23. Accordingly, charging circuit 21 charges energy storage section 25. Charging circuit 21 is enough so that it can charge energy storage section 25 with constant current Ics. More specifically, a dropper circuit or DC/DC converter is applicable as charging circuit 21. Since charging circuit 21 can charge energy storage section 25 with constant current Ics, capacitance C of energy storage section 25 can be easily identified. Energy storage section 25 is configured by connecting multiple electric double layer capacitors in series (25 pieces in this embodiment).

Current detection circuit 23 detects current Ic charged to energy storage section 25, and is used for control at charging energy storage section 25 with constant current Ics. In this exemplary embodiment, current detection circuit 23 is configured with a shunt resistor and a differential amplifier (both are not illustrated), but is not limited to this configuration. For example, current Ic may be electromagnetically detected using a hall element.

Voltage detection circuit 27 is connected in parallel to energy storage section 25. Voltage detection circuit 27 has a function to detect and output voltage Vc of energy storage section 25. In addition, discharging circuit 29 for supplying power of energy storage section 25 to load 13 at the time of momentary voltage drop is electrically coupled between energy storage section 25 and positive terminal 17. In this exemplary embodiment, discharging circuit 29 is configured with a diode. If voltage of primary power supply 11 drops, the diode is turned on, and power of energy storage section 25 is supplied to load 13. Configuration of discharging circuit 29 is not limited to a diode. A switch which can be externally controlled on and off, or a DC/DC converter is also applicable. If an interactive DC/DC converter is used, it can function as both charging circuit 21 and discharging circuit 29.

In addition, voltage-dividing circuit 31 is connected in parallel to energy storage section 25. Voltage-dividing circuit 31 is configured with three voltage-dividing resistors. More specifically, voltage-dividing circuit 31 is configured with a series circuit of first voltage-dividing resistor 33, second voltage-dividing resistor 35, and third voltage-dividing resistor 36 from the side of positive terminal 17. One end of third voltage-dividing resistor 36 is electrically coupled to ground terminal 19. Since voltage-dividing circuit 31 is configured as above, voltage-dividing circuit 31 outputs first voltage V1 proportional to voltage Vc of energy storage section 25 and second voltage V2 proportional to voltage Vc but different from first voltage V1. Here, first voltage V1 is voltage between first voltage-dividing resistor 33 and second voltage-dividing resistor 35, and second voltage V2 is voltage between second voltage-dividing resistor 35 and third voltage-dividing resistor 36.

First voltage V1 output from voltage-dividing circuit 31 is input to first comparator 41 together with reference voltage Vr output from reference voltage source 37. In the same way, second voltage V2 output from voltage-dividing circuit 31 is input to second comparator 43 together with reference voltage Vr. In this way, first comparator 41 and second comparator 43 are electrically coupled to energy storage section 25 in an indirect manner.

Each of first comparator 41 and second comparator 43 is configured with a so-called comparator (comparison circuit). A polarity of an input terminal of reference voltage Vr is negative for first comparator 41, and positive for second comparator 43. As reference voltage source 37, a three-terminal regulator is applicable, for example.

By connecting energy storage section 25 to first comparator 41 and second comparator 43 via voltage-dividing circuit 31, voltage-dividing circuit 31 reduces voltage Vc to the voltages proportional to voltage Vc even if voltage Vc is as high as, for example, about 50V at the maximum. Therefore, there is no need to use a high withstand voltage comparator for neither first comparator 41 nor second comparator 43.

An output of first comparator 41 and an output of second comparator 43 are electrically coupled at contact point 45. Contact point 45 is electrically coupled to pull-up voltage source 49 that has pull-up voltage Vcc via pull-up resistor 47. This connection makes the voltage of contact point 45 a low voltage level (hereafter referred to as "Lo") if at least one of the outputs of first comparator 41 and second comparator 43 is Lo close to 0. Both outputs of first comparator 41 and second comparator 43 are in a high-voltage level (hereafter referred to as "Hi") close to 5V determined by pull-up voltage Vcc and resistance of pull-up resistor 47, voltage of contact point 45 becomes Hi. Accordingly, voltage of contact point 45 becomes either Hi or Lo depending on first voltage V1 and second voltage V2 output from voltage-dividing circuit 31.

Temperature sensor 51 for detecting temperature T of energy storage section 25 is also provided in energy storage section 25. In this exemplary embodiment, temperature sensor 51 is provided inside a case (not illustrated) housing 25 of electric double layer capacitors. As temperature sensor 51, a thermistor that is highly sensitive to temperature is employed. However, temperature sensor 51 is not limited to the thermistor. Other elements such as a thermocouple, platinum temperature-sensing element, and pyroelectric sensor are also applicable.

Charging circuit 21, current detection circuit 23, voltage detection circuit 27, contact point 45, and temperature sensor 51 are connected to control circuit 53 by signal lines, respectively. Control circuit 53 is configured with a microcomputer and peripheral circuits (both not illustrated), and reads current Ic from current detection circuit 23, voltage Vc of energy storage section from voltage detection circuit 27, and temperature T from temperature sensor 51. In addition, contact point 45 is connected to input port 55 of control circuit 53. Accordingly, voltage of contact point 45 that is Hi or Lo (hereafter referred to as "voltage detection signal HL") is input to the microcomputer of control circuit 53 via input port 55. Still more, control circuit 53 controls charging of energy storage section 25 by outputting control signal cont to charging circuit 21. Furthermore, control circuit 53 is also connected to external control circuit 59 via data terminal 57. Therefore, a range of pieces of data including current Ic, voltage Vc of energy storage section, temperature T, and operation state of energy storage device 15A are exchanged between control circuit 53 and external control circuit 59 using data signal data. External control circuit 59 corresponds to an overall monitor device if energy storage device 15A is used for backup of, for example, commercial AC power supply, and corresponds to a vehicle control circuit if energy storage device 15A is used for cars.

Next, the operation of energy storage device 15A is described. First, a basic operation of energy storage device 15A is described. Control circuit 53 sends control signal cont to charging circuit 21 so as to charge energy storage section 25 if primary power supply 11 is operating normally and voltage Vc is not yet full-charge voltage (e.g., 50V). Upon receiving this signal, charging circuit 21 charges power of primary power supply 11 to energy storage section 25. Here, control circuit 53 charges energy storage section 25 with constant current Ics (e.g., 5A) until voltage Vc of energy storage section 25 detected by voltage detection circuit 27 reaches the full-charge voltage. Control circuit 53 monitors current Ic detected by current detection circuit 23, and controls charging circuit 21, so as to charge energy storage section 25 with constant current Ics.

In this exemplary embodiment, control circuit 53 learns the state of normal operation of primary power supply 11 by data signal data from external control circuit 59. Other than this, for example, a primary power supply voltage detection circuit (not illustrated) may be provided to positive terminal 17 to detect voltage of primary power supply 11 by control circuit 53. This enables learning of the state of primary power supply 11 in a self-contained manner in energy storage device 15A.

If energy storage section 25 is fully charged, control circuit 53 controls charging circuit 21 to apply a constant voltage to energy storage section 25 so that voltage Vc maintains fully charged voltage. This enables supply of power from energy storage section 25 to load 13 anytime when primary power supply 11 goes into a momentary voltage drop.

If a momentary voltage drop occurs in primary power supply 11, charging circuit 29 configured with a diode is turned on. This is due to the voltage of primary power supply 11 falling below voltage Vc by the momentary voltage drop. As a result, power in energy storage section 25 is supplied to load 13 via discharging circuit 29. Accordingly, since voltage Vc detected by voltage detection circuit 27 reduces, control circuit 53 detects this change, and outputs control signal cont to stop charging circuit 21. This control reduces the possibility of backflow of the current output from discharging circuit 29 to the side of energy storage section 25 by charging circuit 21.

If primary power supply 11 recovers from the momentary voltage drop, voltage at the cathode side of discharging circuit 29 becomes high. Discharging circuit 29 thus automatically turns off. Accordingly, voltage Vc of energy storage section 25 approximately retains voltage at the time discharging circuit 29 is turned off. Control circuit 53 detects this change in voltage Vc, and controls charging circuit 21 to fully charge energy storage section 25 again if discharge from energy storage section 25 is stopped and primary power supply 11 resumes the normal operation. Repetition of these operations enables continuous driving of load 13 even if voltage of primary power supply 11 momentarily drops.

Next is described how to calculate capacitance C of energy storage section 25 and the operation for determining characteristic degradation based on the result in above energy storage device 15A.

First, a measuring principle of capacitance C is the same as the prior art. More specifically, capacitance C can be calculated using Formula (I), based on voltage change width $\Delta Vc$ of voltage Vc of energy storage section 25 in period tm while energy storage section 25 is charged with constant current Ics. Since constant current Ics is a preset value, how to calculate period tm and voltage change width $\Delta Vc$ are described with reference to FIG. 2.

$$C = Ics \cdot tm / \Delta Vc \qquad (1)$$

FIG. 2 is a time-dependent characteristics chart of voltage Vc of energy storage section 25 and voltage detection signal HL at charging energy storage section 25. Since energy storage section 25 is charged with constant current Ics, voltage Vc and time t establishes a linear relationship. If voltage change width ΔVc in certain period tm is obtained, capacitance C can be calculated using Formula (I). Period tm is duration of time from time t1 to time t2, and ΔVc is a voltage change width from first predetermined voltage Vc1 to second predetermined voltage Vc2. It means a difference between second predetermined voltage Vc2 and first predetermined voltage Vc1.

Next is described how to obtain voltage change width ΔVc and period tm in this exemplary embodiment. Voltage-dividing circuit 31 outputs first voltage V1 and second voltage V2 from voltage Vc. These voltages and the same reference voltage Vr are input to first comparator 41 and second comparator 43, respectively. As previously described, first voltage V1 is voltage between first voltage-dividing resistor 33 and second voltage-dividing resistor 35, and second voltage V2 is voltage between second voltage-dividing resistor 31 and third voltage-dividing resistor 36. Accordingly, it is apparent from the circuit in FIG. 1 that first voltage V1 is higher than second voltage V2. First voltage-dividing resistor 33, second voltage-dividing resistor 35, and third voltage-dividing resistor 36 are all fixed resistors. Resistances of these resistors are predetermined such that first voltage V1 reaches reference voltage Vr when voltage Vc of energy storage section 25 reaches first predetermined voltage Vc1, and second voltage V2 reaches reference voltage Vr when voltage Vc reaches second predetermined voltage Vc2. On determining these resistances, it is considered that first voltage V1 and second voltage V2 fall within allowable input voltage of the comparators configuring first comparator 41 and second comparator 43.

By determining the resistances in this way, first voltage V1 and second voltage V2 corresponds to voltage Vc, and first predetermined voltage Vc1 and second predetermined voltage Vc2 corresponds to reference voltage Vr. Accordingly, first voltage V1 of voltage-dividing circuit 31 and reference voltage Vr corresponding to first predetermined voltage Vc1 are input to first comparator 41, and an output of first comparator 41 is inverted when voltage Vc (corresponding to first voltage V1) reaches second predetermined voltage Vc1 (corresponding to reference voltage Vr). In the same way, second voltage V2 of voltage-dividing circuit 31 and reference voltage Vr corresponding to second predetermined voltage Vc2 are input to second comparator 43, and an output of second comparator 43 is inverted when voltage Vc (corresponding to second voltage V2) reaches second predetermined voltage Vc2 (corresponding to reference voltage Vr).

First predetermined voltage Vc1 is set to 45V, and second predetermined voltage Vc2 is set to 47V. However, these values are just an example. They are appropriately determined depending on a magnitude of constant current Ics and full-charge voltage of energy storage section 25. If energy storage device 15A is used as a backup power supply, energy storage device 15A is normally almost full. Accordingly, if capacitance C is measured to find characteristic degradation in energy storage section 25, it is preferable to set first predetermined voltage Vc1 and second predetermined voltage Vc2 close to the full-charge voltage. This enables application of sufficient voltage to load 13 by energy storage device 15A even if momentary voltage drop occurs in primary power supply 11 at measuring capacitance C while energy storage device 15A is in use.

As described above, first voltage V1 is higher than second voltage V2, the reference voltage Vr is the same for first comparator 41 and second comparator 43. Therefore, if voltage Vc increases by charging energy storage section 25, first voltage V1 first reaches reference voltage Vr. This means that, as shown at time t1 in FIG. 2, voltage Vc has reached first predetermined voltage Vc1. As a result, the output of first comparator 41 is inverted from Lo to Hi. On the other hand, since second voltage V2 has not yet reached reference voltage Vr, the output of second comparator 43 remains Hi. This is because reference voltage Vr is input to the positive side in second comparator 43, which is opposite to first comparator 41. The output of second comparator 43 remains Hi, if second voltage V2 has not reached reference voltage Vr.

As described above, the outputs of first comparator 41 and second comparator 43 are connected at contact point 45, and are pulled up by pull-up voltage source 49. Accordingly, if both outputs of first comparator 41 and second comparator 43 are Hi, the voltage at contact point 45, i.e., voltage detection signal HL, becomes Hi. This is indicated in FIG. 2. If first voltage V1 reaches reference voltage Vr at time t1, voltage detection signal HL is inverted from Lo to Hi.

Next, if charging of energy storage section 25 continues, second voltage V2 reaches reference voltage Vr. This is equivalent to the state that voltage Vc has reached second predetermined voltage Vc2 at time t2 in FIG. 2. As a result, the output of second comparator 43 is inverted from Hi to Lo. On the other hand, since first voltage V1 has already reached reference voltage Vr, the output of first comparator 41 remains Hi. Therefore, voltage detection signal HL, which is the voltage at contact point 45, becomes Lo. In this way, if second voltage V2 reaches reference voltage Vr at time t2, voltage detection signal HL is inverted from Hi to Lo.

Since first predetermined voltage Vc1 and second predetermined voltage Vc2 are determined in advance, voltage change width ΔVc can also be obtained in advance. Therefore, control circuit 53 obtains period tm from inversion of voltage detection signal HL in FIG. 2. More specifically, control circuit 53 measures a duration of time from inversion of voltage detection signal HL at time t1 to inversion again at time t2, using a counter (not illustrated) built-in in control circuit 53 to obtain period tm. This period tm is the same as the duration of time from inversion of the output of first comparator 41 to inversion of the output of second comparator 43.

By obtaining period tm in this way, capacitance C of energy storage section 25 can be calculated by assigning this period tm, and constant current Ics and voltage change width ΔVc, which are already identified, to Formula (1). Capacitance C becomes smaller as characteristics of energy storage section 25 degrade. Therefore, if capacitance C is lower than a predetermined marginal characteristic degradation value, the characteristics of energy storage section 25 are determined to be degraded.

If capacitance C is calculated in this way, characteristic degradation can be more accurately determined due to the next reasons. First, control circuit 53 only needs to measure period tm, and thus the counter of microcomputer configuring control circuit 53 is used. Resolution performance of this counter is about a clock frequency of the microcomputer. Therefore, measurement accuracy of period tm is extremely high compared to the accuracy of conventional 10-bit A/D converter.

Still more, as resistances of first voltage-dividing resistor 33, second voltage-dividing resistor 35, and third voltage-dividing resistor 36 change such as by ambient temperature, first voltage V1 and second voltage V2 also change. However, their change widths are almost equal. In other words, for example, if first voltage V1 changes and first predetermined voltage Vc1, which is calculated by inverse operation from first voltage V1, changes from 45V to 45.2V; second voltage V2 also changes. Therefore, second predetermined voltage Vc2 calculated by inverse operation changes from 47V to 47.2 V. Accordingly, voltage change width ΔVc stays 2V in both cases before and after the change.

Furthermore, even if reference voltage Vr changes, period tm is constant, although inversion time of voltage detection signal HL changes. This is because reference voltage Vr is input to both of first comparator 41 and second comparator 43. Accordingly, for calculating capacitance C, only a binary signal (voltage detection signal HL) of whether or not the voltage has reached first predetermined voltage Vc1 and second predetermined voltage Vc2 is needed without directly detecting voltage Vc of energy storage section 25. Therefore, capacitance C can be more accurately calculated by eliminating a cause of error of the conventional A/D converter.

Circuit configuration for calculating capacitance C in the way described above includes, as shown in FIG. 1, voltage-dividing circuit 31, first comparator 41, second comparator 43, pull-up resistor 47, and pull-up voltage source 49. This extremely simple circuit configuration enables calculation of capacitance C of energy storage section 25 with high accuracy.

To calculate capacitance C with further higher accuracy, for example, first voltage-dividing resistor 33, second voltage-dividing resistor 35, and third voltage-dividing resistor 36 are mounted at positions close to each other on the same circuit board. This arrangement further encourages changes of resistances of first voltage-dividing resistor 33, second voltage-dividing resistor 35, and third voltage-dividing resistor 36 in the same manner, depending on ambient temperature. Since there is only one reference voltage source 37 and pull-up voltage source 49, they are not necessarily mounted on the same circuit board. However, from the view of structural simplification and downsizing of energy storage device 15A by employing a single circuit board, it is preferable to mount these components also on the same circuit board.

Next is described the operation for determining characteristic degradation by calculating capacitance C of energy storage device 15A with reference to a flow chart in FIG. 3. FIG. 3 shows a sub-routine executed as required from a main routine (not illustrated) of software built in control circuit 53.

When the sub-routine in FIG. 3 is executed while charging energy storage section 25 with constant current Ics, control circuit 53 first monitors the state of input port 55. Next, control circuit 53 determines whether or not voltage detection signal HL input to input port 55 is inverted from Lo to Hi (S13). If no inversion takes place (No in S13), the operation returns to S11, and control circuit 53 continues monitoring of the state of input port 55.

On the other hand, if voltage detection signal HL is inverted (Yes in S13), it means that first voltage V1 has reached reference voltage Vr. Once voltage detection signal HL is inverted, control circuit 53 ignores any repeated inversion due to chattering of first comparator 41 in the subsequent operation until the sub-routine shown in FIG. 3 is completed. Through this operation, software hysteresis is given to voltage detection signal HL. Alternatively, this hysteresis may be set not to invert voltage again by a hardware system, once the voltage is inverted, until the voltage exceeds a predetermined voltage.

If first voltage V1 reaches reference voltage Vr by Yes in S13, control circuit 53 starts the counter built-in in its microcomputer (S15). In FIG. 3, the operations of S11 and S13 are repeated until voltage detection signal HL is inverted. However, if voltage detection signal HL is inverted in the middle of these operations, a slight gap in starting of the counter occurs. Accordingly, to calculate capacitance C with further higher accuracy, an interrupt is generated by inversion of voltage detection signal HL, and the counter starts at an interrupt destination.

Next, control circuit 53 monitors again the state of input port 55 (S17), and determines whether or not voltage detection signal HL input to input port 55 is inverted from Hi to Lo (S19). If no inversion takes place (No in S19), the operation returns to S17, and control circuit 53 continues monitoring of the state of input port 55.

On the other hand, if voltage detection signal HL is inverted (Yes in S19), control circuit 53 determines that second voltage V2 has reached reference voltage Vr. Same as above, software hysteresis is also given to this operation. Control circuit 53 stops the counter when Yes is selected in S19 (S21). To calculate capacitance C with further higher accuracy, an interrupt is generated by inversion of voltage detection signal HL, as described above, and the counter is stopped at an interrupt destination. Then, period tm is calculated based on a predetermined proportional constant between a counter value and time because the counter value is proportional to period tm (S23).

Next, control circuit 53 calculates capacitance C of energy storage section 25 based on Formula (1) using calculated period tm (S25). Constant current Ics and voltage change width ΔVc, which are already identified values, are stored in a memory of the microcomputer in advance.

In this exemplary embodiment, a value of constant current Ics is stored in the memory, but current detection circuit 23 may be used for measuring current Ic as required. In this case, the use of actual current value for calculating capacitance C enables calculation of capacitance with further higher accuracy.

Then, control circuit 53 obtains temperature T from temperature sensor 51 (S27). Capacitance C is corrected based on correlation of temperature T and capacitance C stored in the memory in advance (S29). Capacitance C and temperature T has a nonlinear correlation that capacitance C gradually declines when temperature T decreases. Accordingly, a change rate of capacitance C is calculated based on the correlation with present temperature T, and capacitance C is corrected based on temperature T by multiplying capacitance C calculated in S25 by the change rate. This temperature correction improves the accuracy of determination of characteristic degradation described below.

Next, control circuit 53 compares capacitance C after temperature correction and marginal characteristic degradation value (S31). The marginal characteristic degradation value is a marginal capacitance that energy storage device 15A cannot be used no longer. This is determined in advance based on specifications of energy storage device 15A, load 13, and so on, and is stored in a memory. As already described, capacitance C reduces in line with characteristic degradation. Therefore, if capacitance C is equal to or below the marginal characteristic degradation value, control circuit 53 determines that characteristics of energy storage section 25 have degraded (Yes in S31). In this case, control circuit 53 outputs the characteristic degradation signal of energy storage section 25 to external control circuit 59 as data signal data (S33). Then, the sub-routine in FIG. 3 is completed, and the operation returns to the main routine. Upon receiving this characteristic degradation signal, external control circuit 59 alerts the user to replace energy storage section 25 or energy storage device 15A through an operation such as alarming.

On the other hand, if capacitance C exceeds the marginal characteristic degradation value (No in S31), energy storage section 25 have not degraded, the sub-routine is completed, and the operation returns to the main routine.

By repeating these operations every time energy storage section 25 is charged, characteristic degradation in energy storage section 25 can be determined with high accuracy, and reliability of energy storage device 15A thus increases.

While capacitance C is calculated in the sub-routine, and characteristic degradation in energy storage section 25 is determined, charging of energy storage section 25 with constant current Ics may be interrupted due to a momentary voltage drop of primary power supply 11. In this case, control circuit 53 stops the operation for calculating capacitance C. More specifically, since control circuit 53 detects current Ic by current detection circuit 23, current Ic momentarily changes if a momentary voltage drop occurs in primary power supply 11. If this change is detected, control circuit 53 generates an interrupt to immediately stop execution of the sub-routine in FIG. 3. This stops the operation for calculating capacitance C. This operation is executed because an error in period tm, in which voltage Vc of energy storage section 25 changes from first predetermined voltage Vc1 to second predetermined voltage Vc2, occurs by the momentary voltage drop. Accordingly, an error in capacitance C is reduced to enable more accurate determination of characteristic degradation by stopping the operation for calculating capacitance C. Determination of occurrence of a momentary voltage drop is not limited to a change of current Ic. Voltage Vc of energy storage section 25 may be detected by voltage detection circuit 27 to determine occurrence of momentary voltage drop from this change.

With the above structure and operations, capacitance C of energy storage section 25 can be detected with high accuracy using a simple structure. In this exemplary embodiment, pull-up voltage source 49 is independently provided. However, for example, driving voltage source (not illustrated) of first comparator 41 and second comparator 43 may be used commonly. In this case, the circuit configuration becomes simpler because there is no need to provide pull-up voltage source 49 independently. In addition, the microcomputer configured with a series circuit of pull-up voltage source 49 and pull-up resistor 47 connected to input port 55 inside control circuit 53 may be used for control circuit 53. In this case, both pull-up voltage source 49 and pull-up resistor 47 become unnecessary. This further makes the circuit configuration further simpler.

Second Exemplary Embodiment

Figure 4:
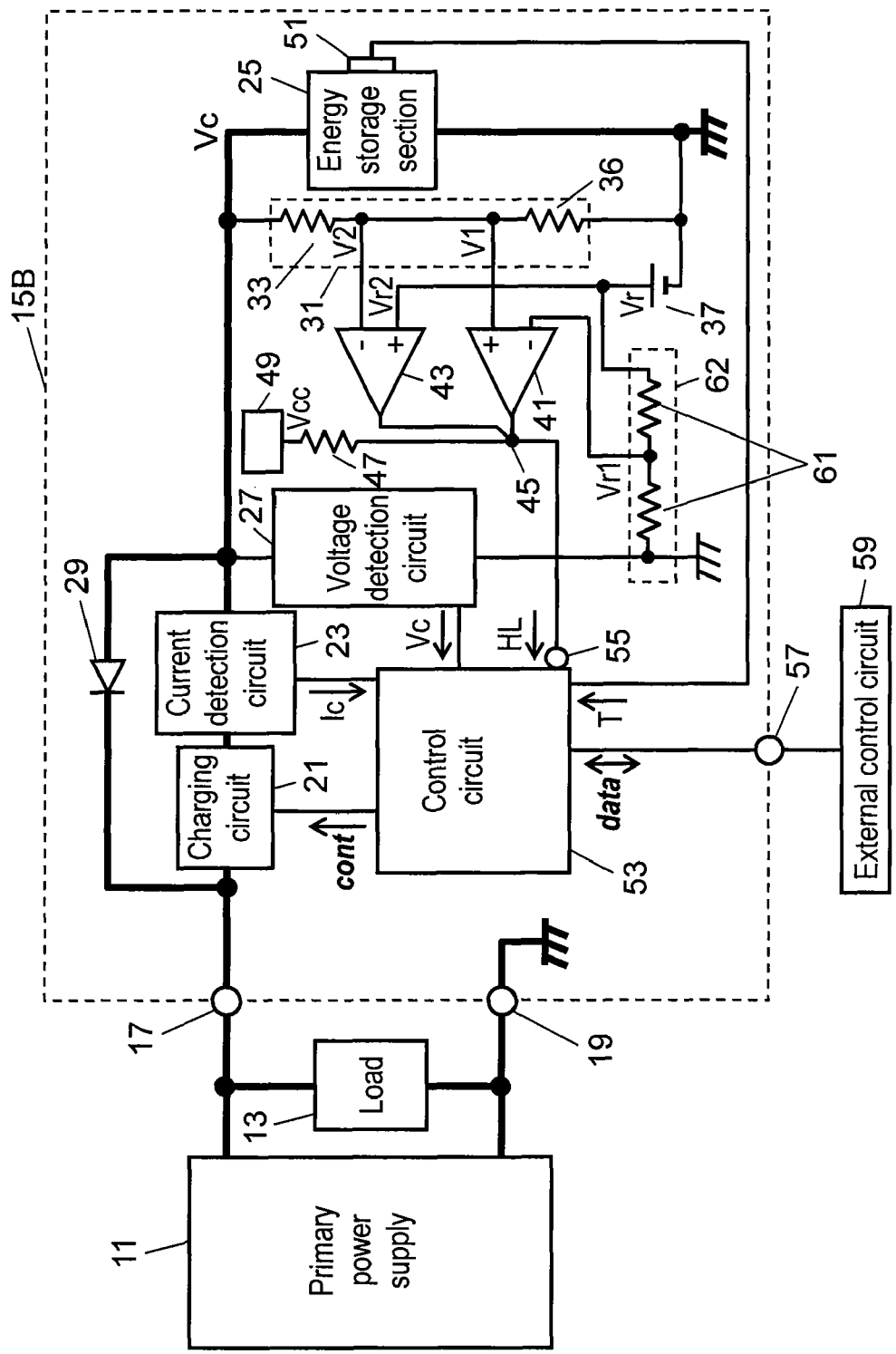
FIG. 4 is a block circuit diagram of an energy storage device in accordance with a second exemplary embodiment of the present invention.

FIG. 4 is a block circuit diagram of an energy storage device in a second exemplary embodiment of the present invention. In FIG. 4, bold lines indicate power lines, and thin lines indicate signal lines. Same reference marks are given to components same as those in FIG. 1 to omit their duplicate details. In other words, a characteristic structure of energy storage device 15B in the second exemplary embodiment is as follows.

1) In voltage-dividing circuit 31, second voltage-dividing resistor 35 is removed, and first voltage-dividing resistor 33 and third voltage-dividing resistor 36 are connected in series. More specifically, voltage-dividing circuit 31 is a first voltage-dividing circuit that is connected in parallel to energy storage section 25, and outputs first voltage V1 smaller than voltage Vc.

2) Voltage between first voltage-dividing resistor 33 and third voltage-dividing resistor 36 is input to first comparator 41 and second comparator 43. Accordingly, voltages input from voltage-dividing circuit 31 to first comparator 41 and second comparator 43 become equivalent. (First voltage V1=Second voltage V2).

3) Series-connected two reference voltage-dividing resistors 61 are provided between the positive side of reference voltage source 37 and ground.

4) Voltage between two reference voltage-dividing resistors 61 (hereafter referred to as "first reference voltage Vr1") is input to first comparator 41. More specifically, two reference voltage-dividing resistors 61 configure second voltage-dividing circuit 62 that is connected in parallel to the reference voltage source, and outputs first reference voltage Vr1 in proportion to reference voltage Vr. First reference voltage Vr1 is smaller than voltage Vr.

Components other than the above are the same as that in the first exemplary embodiment. Positions of first comparator 41 and second comparator 43 in FIG. 4 are different from those in FIG. 1. In addition, reference voltage Vr input to second comparator 43 described in the first exemplary embodiment is called second reference voltage Vr2 in this exemplary embodiment. Accordingly, reference voltage Vr and second reference voltage Vr2 are equivalent.

When the configuration in FIG. 4 is compared with the that in FIG. 1, voltages input from voltage-dividing circuit 31 to first comparator 41 and second comparator 43 become equivalent in the configuration in FIG. 4. And, voltages input from reference voltage source 37 to first comparator 41 and second comparator 43 become different in this configuration in FIG. 4. The operation for inverting outputs of first comparator 41 and second comparator 43 in this exemplary embodiment is as follows.

First, second reference voltage Vr2 input to second comparator 43 is equivalent to reference voltage Vr. Accordingly, same as in the first exemplary embodiment, resistances of first voltage-dividing resistor 33 and third voltage-dividing resistor 36 are set in advance such that second voltage V2 reaches second reference voltage Vr2 when voltage Vc of energy storage section 25 reaches second predetermined voltage Vc2. In addition, it is considered that second voltage V2 falls within an allowable input voltage of a comparator configuring second comparator 43.

Next, first voltage V1 input to first comparator 41 is equivalent to second voltage V2. Accordingly, resistances of two reference voltage-dividing resistors 61 are set such that first voltage V1 reaches first reference voltage Vr1 when voltage Vc of energy storage section 25 reaches first predetermined voltage Vc1. It is apparent from the circuit in FIG. 4 that first reference voltage Vr1 is lower than second reference voltage Vr2 (=Reference voltage Vr), and thus an output of first comparator 41 is inverted before an output of second comparator 43 is inverted.

By setting resistances of first voltage-dividing resistor 33, third voltage-dividing resistor 36, and two reference voltage-dividing resistors 61 in this way, first voltage V1 and second voltage V2 correspond to voltage Vc. And, first predetermined voltage Vc1 and second predetermined voltage Vc2 correspond to first reference voltage Vr1 and second reference voltage Vr2, respectively. Accordingly, first voltage V1 of voltage-dividing circuit 31 and first reference voltage Vr1 corresponding to first predetermined voltage Vc1 are input to first comparator 41. When voltage Vc corresponding to first voltage V1 reaches first predetermined voltage Vc1 corresponding to first reference voltage Vr1, the output of first comparator 41 is inverted. In the same way, second voltage V2 of voltage-dividing circuit 31 and second reference voltage Vr2 corresponding to second predetermined voltage Vc2 are input to second comparator 43, respectively. When voltage Vc corresponding to second voltage V2 reaches second predetermined voltage Vc2 corresponding to second reference voltage Vr2, the output of second comparator 43 is inverted.

In energy storage device 15B as configured above, the operation for calculating capacitance C is the same as that shown in FIG. 3 in the first exemplary embodiment. If a momentary voltage drop occurs during execution of the sub-routine in FIG. 3, the operation for calculating capacitance C is stopped. This is also the same as the first exemplary embodiment. Accordingly, highly accurate detection of capacitance C and determination of characteristic degradation in energy storage section 25 become feasible in the same way as the first exemplary embodiment.

The structure in FIG. 4 allows reduction of the number of resistors used in voltage-dividing circuit 31 from three to two pieces, compared to that in FIG. 1. In FIG. 1, three resistors are preferably disposed at nearby positions on the same circuit board, for example, so that their resistances change similarly against ambient temperature. On the other hand, the structure in FIG. 4 requires consideration to positions of only two resistors against ambient temperature for similar change in their resistances. Accordingly, design flexibility in component layout including resistors on a circuit board increases. However, two reference voltage-dividing resistors 61 also require positional consideration so that their resistances change similarly against ambient temperature. However, there is no need to dispose all of the resistors used in voltage-dividing circuit 31 and two reference voltage-dividing resistors 61 at nearby positions on the circuit board.

With the above configuration and operation, energy storage device 15B that can detect capacitance C of energy storage section 25 with high accuracy is achievable with a simple structure.

Third Exemplary Embodiment

Figure 5:
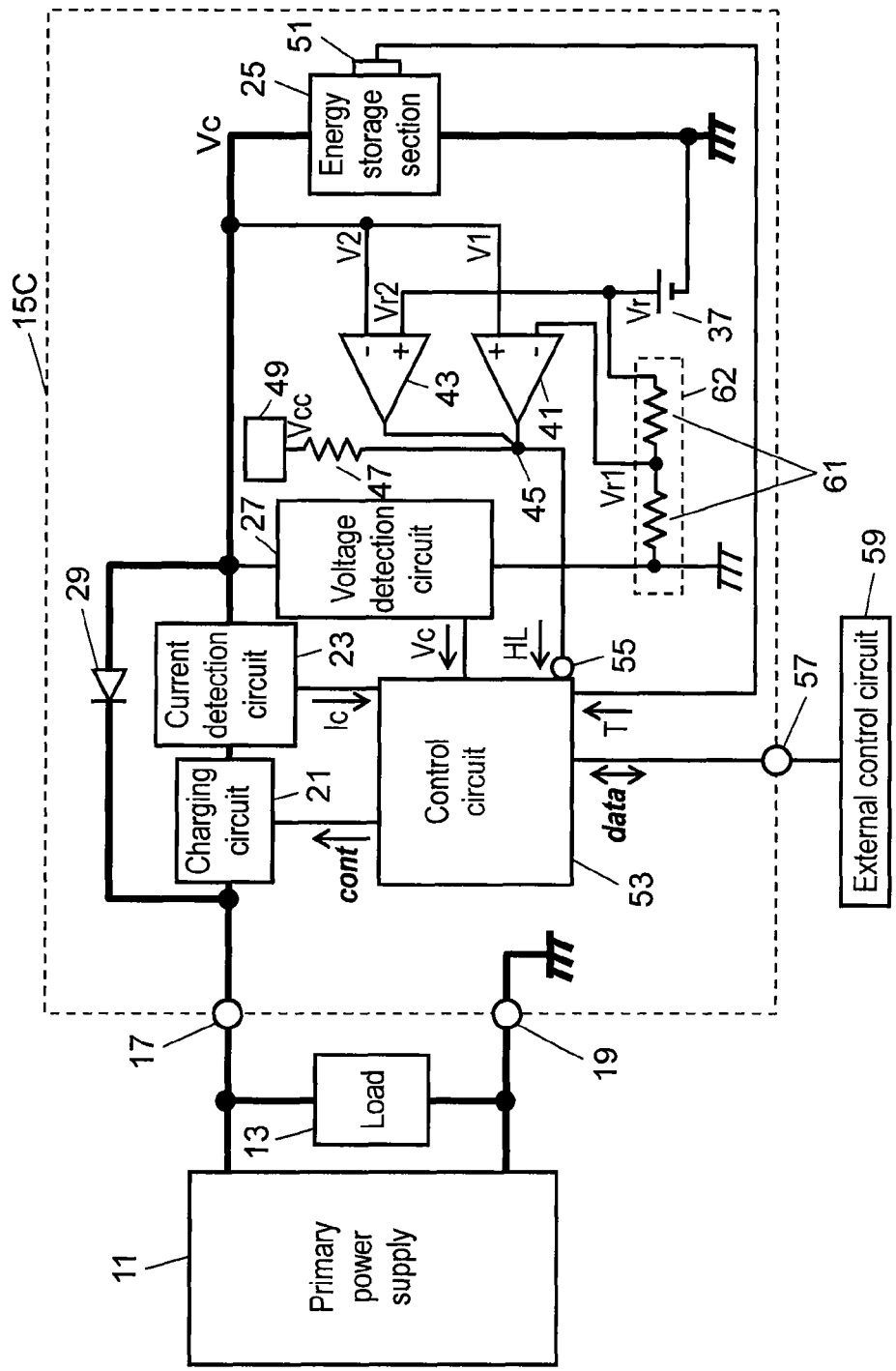
FIG. 5 is a block circuit diagram of an energy storage device in accordance with a third exemplary embodiment of the present invention.

FIG. 5 is a block circuit diagram of an energy storage device in a third exemplary embodiment of the present invention. In FIG. 5, bold lines indicate power lines, and thin lines indicate signal lines. Same reference marks are given to components same as those in FIG. 4 to omit duplicate details. In other words, a characteristic structure of energy storage device 15C in this exemplary embodiment, compared to that of the second exemplary embodiment, is as follows.

1) Voltage-dividing circuit 31 is eliminated

2) Voltage Vc of energy storage section 25 is directly input to first comparator 41 and second comparator 43. Accordingly, first voltage V1 and second voltage V2 are equivalent to voltage Vc.

3) Since voltage Vc is directly input to first comparator 41 and second comparator 43, high withstand voltage comparator are employed as first comparator 41 and second comparator 43.

4) Reference voltage Vr (=Second reference voltage Vr2) of reference voltage source 37 is set to a high voltage of 47V. Accordingly, second reference voltage Vr2 becomes equivalent to second predetermined voltage Vc2.

5) Resistances of two reference voltage-dividing resistors 61 are set such that voltage (first reference voltage Vr1) between two reference voltage-dividing resistors 61 becomes 45V. Accordingly, first reference voltage Vr1 is equivalent to first predetermined voltage Vc1.

Components other than the above are the same as that in FIG. 4. With the above structural changes, the operation for inverting the outputs of first comparator 41 and second comparator 43 is as follows in this exemplary embodiment.

First, first voltage V1 (=Voltage Vc) and first reference voltage Vr1 (=First predetermined voltage Vc1) are input to first comparator 41, respectively. Accordingly, the output of first comparator 41 is inverted when voltage Vc (=First voltage V1) reaches first predetermined voltage Vc1 (=First reference voltage Vr1). On the other hand, second voltage V2 (=Voltage Vc) and second reference voltage Vr2 (=Second predetermined voltage Vc2) are input to second comparator 43, respectively. Accordingly, the output of second comparator 43 is inverted when voltage Vc (=Second voltage V2) reaches second predetermined voltage Vc2 (=Second reference voltage Vr2).

In energy storage device 15C as configured above, the operation for calculating capacitance C is the same as that in FIG. 3 in the first exemplary embodiment. The operation for stopping calculation of capacitance C when a momentary voltage drop occurs during execution of the sub-routine in FIG. 3 is also the same as that in the first exemplary embodiment. Accordingly, highly accurate detection of capacitance C and determination of characteristic degradation in energy storage section 25 become feasible in the same way as the first exemplary embodiment.

The structure in FIG. 5 eliminates voltage-dividing circuit 31, compared to the structure in FIG. 4. The circuit configuration can thus be made simpler. However, expensive comparators for directly inputting high voltage are necessary. Same as the second exemplary embodiment, two reference voltage-dividing resistors 61 are preferably disposed at positions that their resistances change similarly against ambient temperature.

With the above configuration and operation, energy storage device 15C that can detect capacitance C of energy storage section 25 with high accuracy is achievable with a simple structure.

Fourth Exemplary Embodiment

Figure 6:
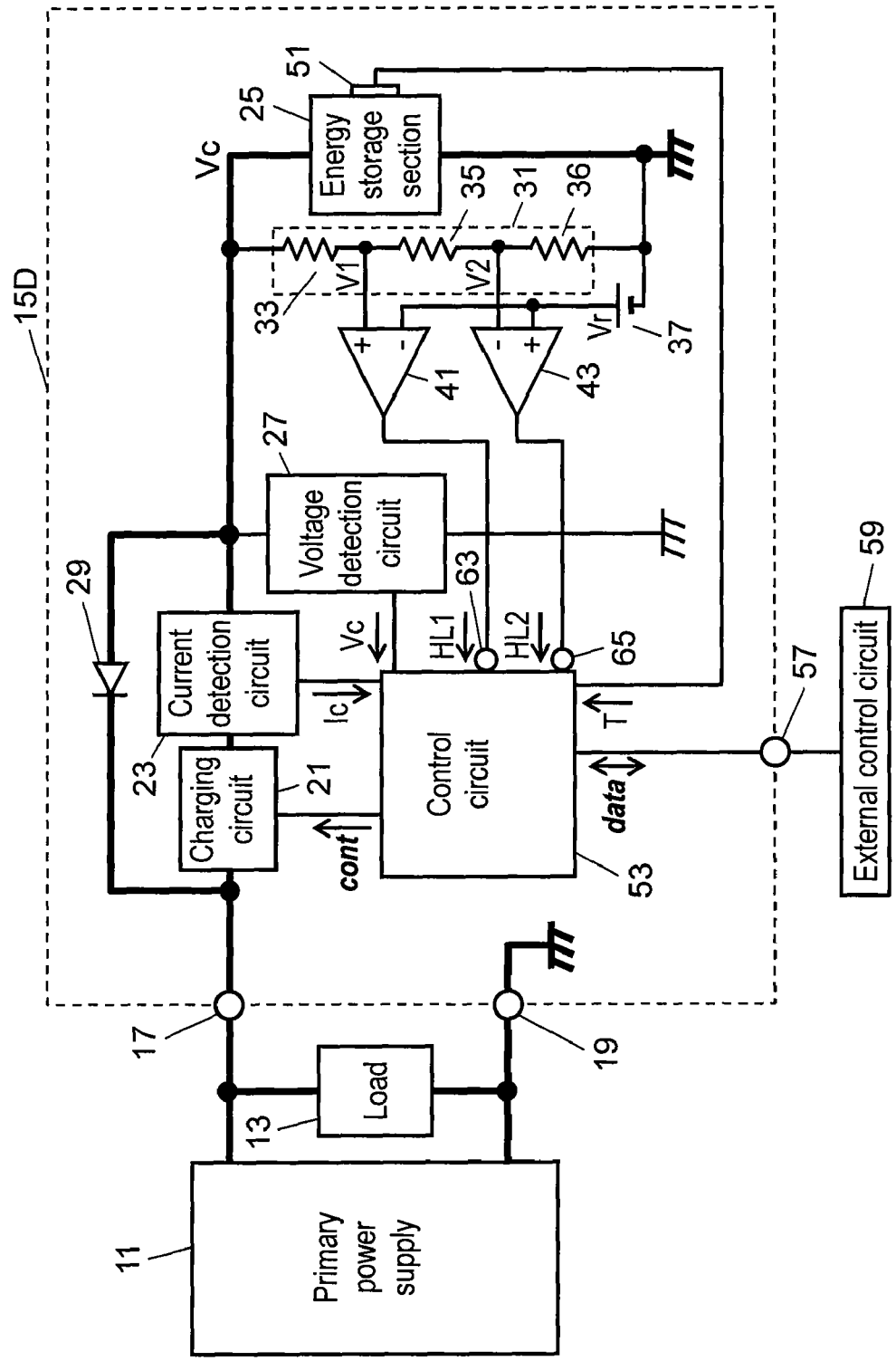
FIG. 6 is a block circuit diagram of an energy storage device in accordance with a fourth exemplary embodiment of the present invention.
Figure 7:
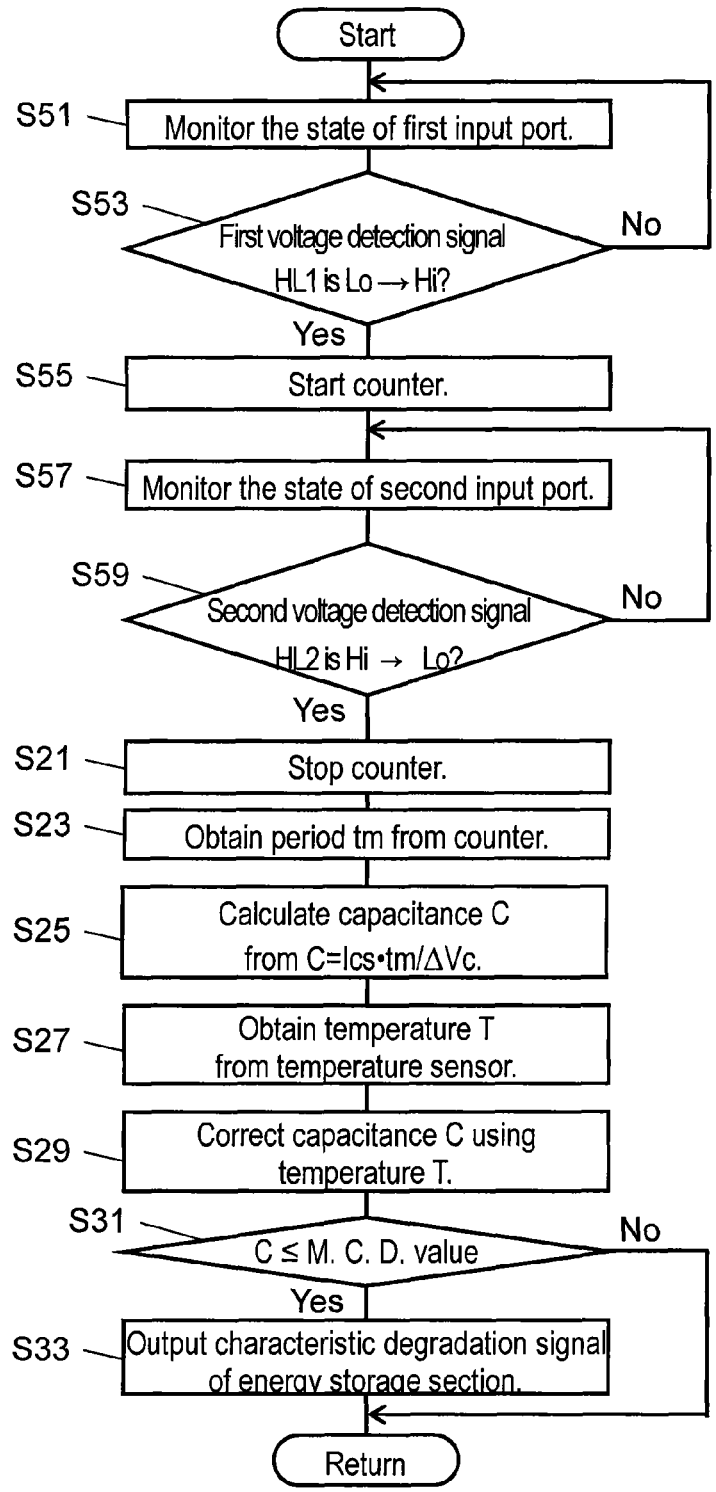
FIG. 7 is a flow chart of an operation for calculating capacitance of the energy storage section and determining characteristic degradation in the energy storage device in FIG. 6.

FIG. 6 is a block circuit diagram of an energy storage device in a fourth exemplary embodiment of the present invention. FIG. 7 is a flow chart of the operation for determining characteristic degradation by calculating capacitance of the energy storage device in the fourth exemplary embodiment. In FIG. 6, bold lines indicate power lines, and thin lines indicate signal lines. In FIG. 6, same reference marks are given to components same as those in FIG. 1 to omit duplicate details. In other words, a characteristic structure of energy storage device 15D in this exemplary embodiment, compared to that in the first exemplary embodiment, is as follows.

1) First input port 63 and second input port 65 are provided in control circuit 53, instead of input port 55. The output of first comparator 41 is connected to first input port 63 of control circuit 53, and the output of second comparator 43 is connected to second input port 65 of control circuit 53 independently.

2) Pull-up resistor 47 and pull-up voltage source 49 are eliminated.

3) As a result, outputs of first comparator 41 and second comparator 43 are not pulled up. Accordingly, first comparator 41 and second comparator 43 are changed from comparators to operational amplifiers.

Other components are the same as those in FIG. 1. The above changes in the configuration also achieve the operation for inverting the outputs of first comparator 41 and second comparator 43 in the same way as the first exemplary embodiment.

As energy storage section 25 is charged, the output of first comparator 41 (hereafter referred to as "first voltage detection signal HL1") is inverted first, and then the output of second comparator 43 (hereafter referred to as "second voltage detection signal HL2") is inverted. Since the two signals are independently input to control circuit 53 in this exemplary embodiment, the operation for determining characteristic degradation by calculating capacitance C of energy storage section 25 differs from the first exemplary embodiment in some points. The operation is described centering on these different points with reference to a flow chart (sub-routine) in FIG. 7. The same operations in FIG. 7 and FIG. 3 are given the same step numbers to omit their duplicate details.

If the sub-routine in FIG. 7 is executed, control circuit 53 first monitors the state of first input port 63 (S51). Next, control circuit 53 determines whether or not first voltage detection signal HL1 input to first input port 63 is inverted from Lo to Hi. If not inverted (No in S53), the operation returns to S51 to continue monitoring of first input port 63.

On the other hand, if first voltage detection signal HL1 is inverted (Yes in S53), it means that first voltage V1 has reached reference voltage Vr. Control circuit 53 thus starts a counter built in a microcomputer of control circuit 53 (S55). Next, control circuit 53 monitors the state of second input port 65 (S57), and determines whether or not second voltage detection signal HL2 input to second input port 65 is inverted from Hi to Lo (S59). If not inverted (No in S59), the operation returns to S57, and control circuit 53 continues monitoring of second input port 65.

On the other hand, if second voltage detection signal HL2 is inverted (Yes in S59), it means that second voltage V2 has reached reference voltage Vr. Control circuit 53 then stops the counter (S21). The operations of and after S21 are the same as those in FIG. 3, and thus their description is omitted. The operation for stopping calculation of capacitance C when a momentary voltage drop occurs during execution of the sub-routine in FIG. 7 is also the same as that in the first exemplary embodiment. In addition, same as the sub-routine in FIG. 3, hysteresis may be provided for determining inversion of first voltage detection signal HL1 and second voltage detection signal HL2, or the counter may be started or stopped by an interrupt at occurrence of inversion. These operations also enable highly accurate calculation of capacitance C of energy storage section 25 and determination of characteristic degradation in energy storage section 25.

The configuration in this exemplary embodiment eliminates the need of pull-up resistor 47 and pull-up voltage source 49, compared to the first exemplary embodiment. Accordingly, a further simpler circuit configuration is achievable. However, this configuration requires two input ports in control circuit 53. Accordingly, adoption of the configuration in the first exemplary embodiment or the configuration in this exemplary embodiment is determined based on the available number of input ports.

With the above configuration and operation, energy storage device 15D that can detect capacitance C of energy storage section 25 with high accuracy is achievable with a simple structure.

A layout of three resistors in voltage-dividing circuit 31 is preferably considered such that their resistances change similarly against ambient temperature. This is also the same as the first exemplary embodiment.

In addition, in this exemplary embodiment, voltage-dividing circuit 31 may be simplified by the use of two resistors, and two reference voltage voltage-dividing resistors 61 may be provided to reference voltage source 37, same as those in the second exemplary embodiment. In this case, an effect is also the same as that in the second exemplary embodiment.

Furthermore, first input port 63 and second input port 65 are independent in this exemplary embodiment. Therefore, outputs of first comparator 41 and second comparator 43 may be reversed. More specifically, first voltage detection signal HL1 may be configured to invert either from Lo to Hi or Hi to Lo. This is also the same for second voltage detection signal HL2. Accordingly, a combination of inverted outputs of first voltage detection signal HL1 and second voltage detection signal HL2 may be selected as required.

Fifth Exemplary Embodiment

Figure 8:
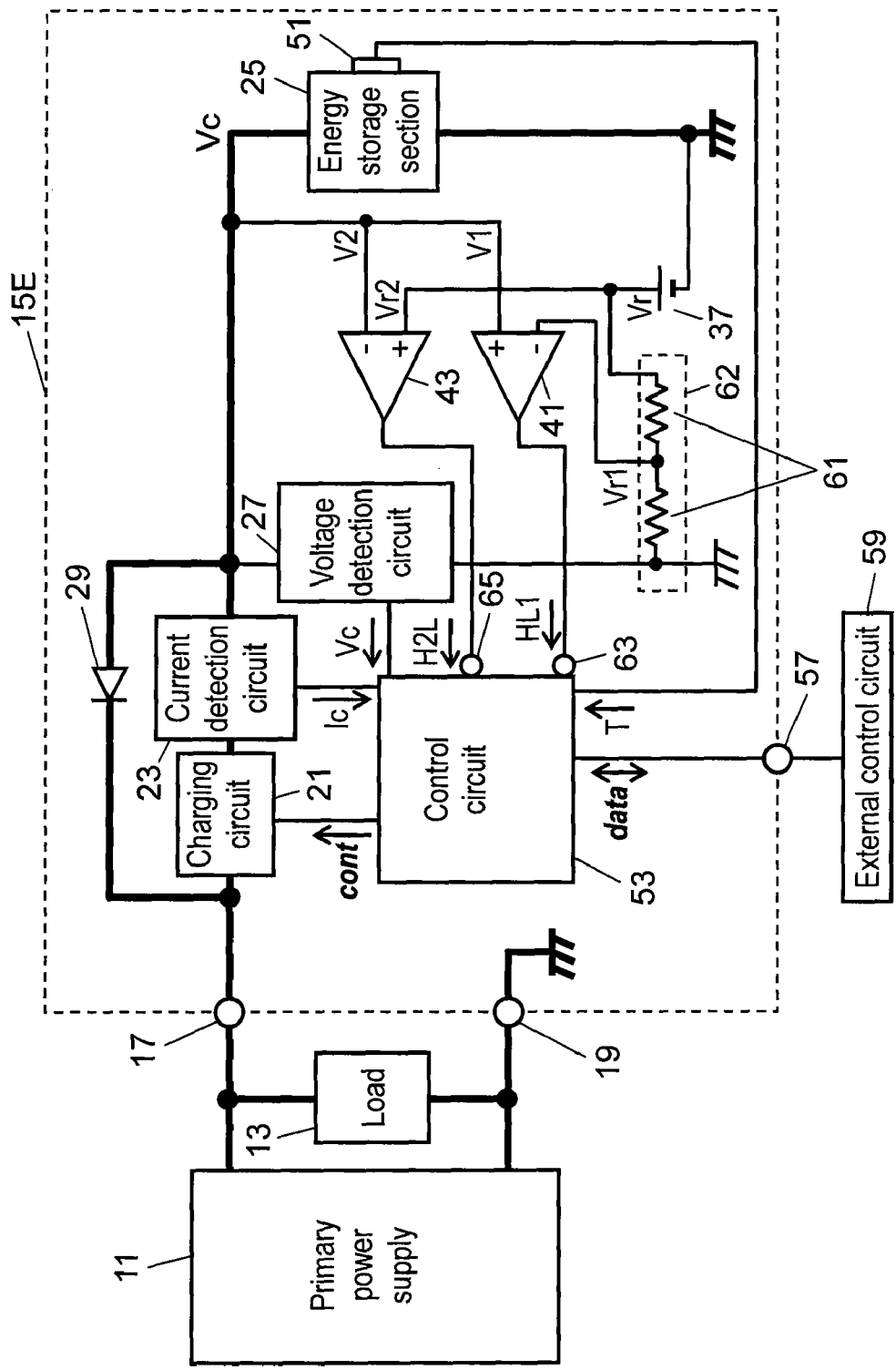
FIG. 8 is a block circuit diagram of an energy storage device in accordance with a fifth exemplary embodiment of the present invention.
Figure 9:
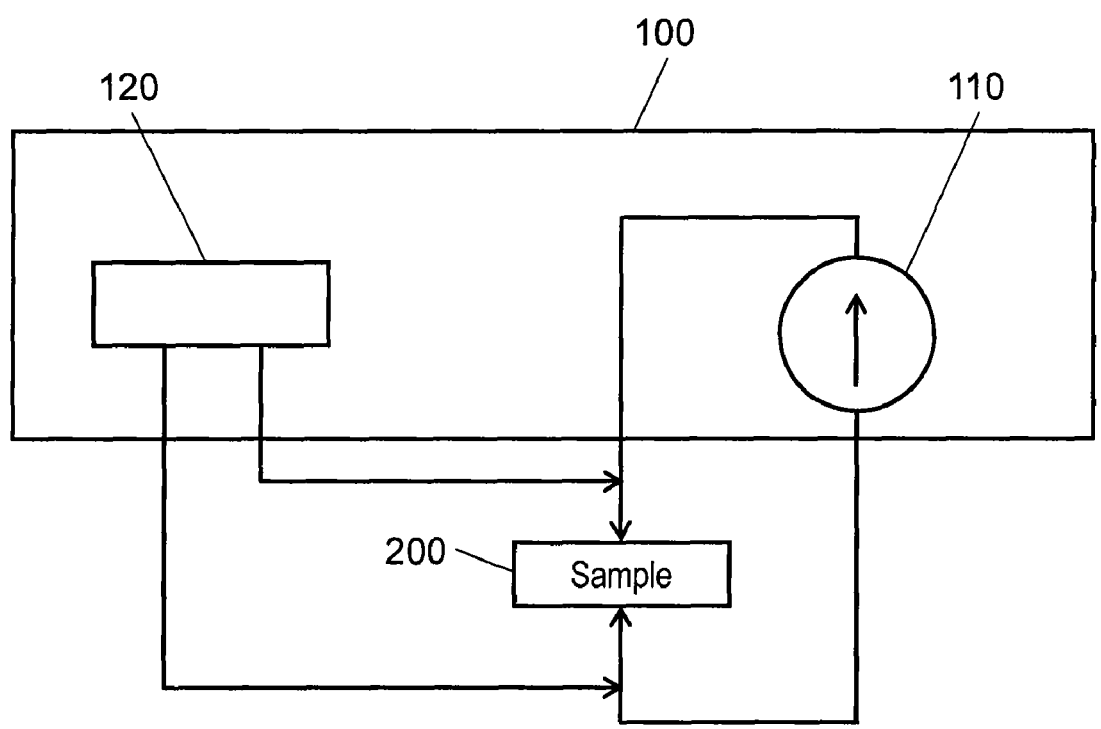
FIG. 9 is a schematic diagram of a conventional capacitor performance measuring instrument.

FIG. 8 is a block circuit diagram of an energy storage device in a fifth exemplary embodiment of the present invention. In FIG. 8, bold lines indicate power lines, and thin lines indicate signal lines. In FIG. 8, same reference marks are given to components same as those in FIGS. 5 and 6 to omit their duplicate details. In other words, a characteristic structure in the fifth exemplary embodiment is a combination of elimination of voltage-dividing circuit 31 from the configuration in the fourth exemplary embodiment, and provision of two reference voltage-dividing resistors 61 in reference voltage source 37 as in the third exemplary embodiment.

Accordingly, since voltage Vc of energy storage section 25 is directly input to first comparator 41 and second comparator 43, high withstand voltage operational amplifiers are adopted. First voltage V1 and second voltage V2 are equivalent to voltage Vc of energy storage section 25. In addition, resistances of two reference voltage-dividing resistors 61 are set such that second reference voltage Vr2 becomes a high voltage of 47V, and first reference voltage Vr1 becomes 45V. Accordingly, first reference voltage Vr1 is equivalent to first predetermined voltage Vc1, and second reference voltage Vr2 is equivalent to second predetermined voltage Vc2. Other components are the same as those in FIG. 6.

The operation for inverting outputs of first comparator 41 and second comparator 43 in this exemplary embodiment is the same as that in the third exemplary embodiment. More specifically, first voltage V1 (=Voltage Vc), and first reference voltage Vr1 (=First predetermined voltage Vc1) are input to first comparator 41, respectively. Accordingly, the output of first comparator 41 is inverted when voltage Vc (=First voltage V1) reaches first predetermined voltage Vc1 (=First reference voltage Vr1). This output is input to first input port 63 as first voltage detection signal HL1. Second voltage V2 (=Voltage Vc) and second reference voltage Vr2 (=Second predetermined voltage Vc2) are input to second comparator 43, respectively. Accordingly, the output of second comparator 43 is inverted when voltage Vc (=Second voltage V2) reaches second predetermined voltage Vc2 (=Second reference voltage Vr2). This output is input to second input port 65 as second voltage detection signal HL2.

The operation for calculating capacitance C of energy storage device 15E as configured above is the same as that in the fourth exemplary embodiment 4 in FIG. 7. In addition, the operation for stopping calculation of capacitance C when a momentary voltage drop occurs during execution of the sub-routine in FIG. 7 is also the same as that in the first exemplary embodiment. Accordingly, the fifth exemplary embodiment also achieves highly accurate detection of capacitance C and determination of characteristic degradation in energy storage section 25 in the same way as the fourth exemplary embodiment.

In the configuration shown in FIG. 8, voltage-dividing circuit 31, pull-up resistor 47, and pull-up voltage source 49 are unnecessary. Accordingly, detection of capacitance C with high accuracy becomes feasible with an extremely simple circuit configuration. However, more number of input ports is needed in control circuit 53, and a change to high withstand voltage operational amplifiers is also required. In addition, two reference voltage-dividing resistors 61 are preferably disposed such that their resistances change similarly against ambient temperature in the same way as the second exemplary embodiment. Also same as the fourth exemplary embodiment, a combination of output inversion of first voltage detection signal HL1 and second voltage detection signal HL2 can be selected as required.

With the above configuration and operation, energy storage device 15E that can detect capacitance C of energy storage section 25 with high accuracy is achievable with a simple structure.

In the first to fifth exemplary embodiments, polarities of input terminals of first comparator 41 and second comparator 43 are given as an example. They may be opposite. In that case, an inverting direction of outputs of first comparator 41 and second comparator 43 becomes opposite. Control circuit 53 also needs to determine inversion of voltage detection signal HL in a reversed way. In this case, depending on circuit configuration, resistance of voltage-dividing circuit 31 or resistance of reference voltage-dividing resistor 61 needs to be changed.

In addition, the first to fifth exemplary embodiments refer to the configuration of providing temperature sensor 51. However, temperature sensor 51 may not be provided if a change in ambient temperature is small, such as in the case of using energy storage device as an emergency power source. In this case, characteristic degradation is determined without applying temperature correction to calculated capacitance C.

Still more, the first to fifth exemplary embodiments execute the operation for calculating capacitance C and determining characteristic degradation in energy storage section 25 during charging of energy storage section 25 with constant current Ics. Other than this configuration, capacitance C may be calculated and characteristic degradation may be determined during discharging with constant current Ics by providing a constant current discharging circuit (not illustrated) that is connected in parallel to energy storage section 25 and can discharge with constant current Ics. In this case, time-dependent characteristics of voltage Vc in FIG. 2 becomes a straight line declining rightward, but capacitance C is calculated in the same way as the first to fifth exemplary embodiments. This configuration of providing a constant current discharge circuit is effective when charging circuit 21 of energy storage section 25 is provided on the side of primary power supply, for example, and constant current charging cannot be controlled within the energy storage device, although characteristic degradation needs to be determined based on capacitance C. Also in this case, calculation of capacitance C is controlled to stop when a momentary voltage drop occurs during discharge. This achieves further accurate determination of characteristic degradation.

Furthermore, the first to fifth exemplary embodiments employ electric double layer capacitors for energy storage section 25. This may be other capacitors such as electrochemical capacitor, or high-power battery.

As described above, the energy storage device of the present invention has a simple structure, and can determine characteristic degradation by calculating capacitance of the energy storage section with high accuracy. Accordingly, the present invention is particularly applicable to an energy storage device for supplying power from its energy storage section at occurrence of a voltage drop in the primary power source.

What is claimed is:

1. An energy storage device comprising:
an energy storage section;
a charging circuit electrically coupled to the energy storage section;
a first comparator electrically coupled to the energy storage section, an output of the first comparator being inverted when a voltage (Vc) of the energy storage section reaches a first predetermined voltage (Vc1);
a second comparator electrically coupled to the energy storage section, an output of the second comparator being inverted when the voltage (Vc) of the energy storage section reaches a second predetermined voltage (Vc2), the second predetermined voltage (Vc2) being greater than the first predetermined voltage (Vc1); and
a control circuit electrically coupled to the charging circuit, the first comparator, and the second comparator;
wherein the control circuit obtains a period (tm) from inversion of the output of the first comparator to inversion of the output of the second comparator at charging the energy storage section with a constant current (Ics), and calculates a capacitance C of the energy storage section based on the period (tm) and a voltage change width (ΔVc) between the first predetermined voltage (Vc1) and the second predetermined voltage (Vc2) that are previously identified.

2. The energy storage device according to claim 1, further comprising:
a voltage-dividing circuit connected in parallel to the energy storage section, the voltage-dividing circuit capable of outputting first voltage (V1) proportional to the voltage (Vc) of the energy storage section and second voltage (V2) proportional to the voltage (Vc) of the energy storage section, the second voltage (V2) being different from the first voltage (V1); and
a reference voltage source capable of outputting a reference voltage (Vr);
wherein the voltage-dividing circuit, the first comparator, and the reference voltage source are connected such that the first voltage (V1) and the reference voltage (Vr) are input to the first comparator; and
the voltage-dividing circuit, the second comparator, and the reference voltage source are connected such that the second voltage (V2) of the voltage-dividing circuit and the reference voltage (Vr) are input to the second comparator.

3. The energy storage device according to claim 1, further comprising:
a first voltage-dividing circuit connected in parallel to the energy storage section, the first voltage-dividing circuit capable of outputting a first voltage (V1) proportional to the voltage (Vc) of the energy storage section, the first voltage (V1) being smaller than the voltage (Vc) of the energy storage section;
a reference voltage source capable of outputting a reference voltage (Vr); and
a second voltage-dividing circuit connected in parallel to the reference voltage source, the second voltage-dividing circuit capable of outputting a first reference voltage (Vr1) proportional to the reference voltage (Vr), the first reference voltage (Vr1) being smaller than the reference voltage (Vr);
wherein the first voltage-dividing circuit, the first comparator, and the second voltage-dividing circuit are connected such that the first voltage (V1) and the first reference voltage (Vr1) are input to the first comparator; and the first voltage-dividing circuit, the second comparator, and the reference voltage source are connected such that the reference voltage (Vr) and the first voltage (V1) are input to the second comparator.

4. The energy storage device according to claim 1, further comprising:
   a reference voltage source capable of outputting a reference voltage (Vr); and
   a voltage-dividing circuit connected in parallel to the reference voltage source, the voltage-dividing circuit capable of outputting a first reference voltage (Vr1) proportional to the reference voltage (Vr), the first reference voltage (Vr) being smaller than the reference voltage (Vr);
   wherein the energy storage section, the voltage-dividing circuit, and the first comparator are connected such that the voltage (Vc) of the energy storage section and the first reference voltage (Vr1) are input to the first comparator; and
   the energy storage section, the second comparator, and the reference voltage source are connected such that the reference voltage (Vr) and the voltage (Vc) of the energy storage section are input to the second comparator.

5. The energy storage device according to claim 1, further comprising:
   a pull-up resistor electrically coupled to a contact point of the output of the first comparator and the output of the second comparator, and
   a pull-up voltage source connected to the contact point via the pull-up resistor, the pull-up voltage source having a pull-up voltage (Vcc);
   wherein the contact point of the output of the first comparator and the output of the second comparator is connected to the control circuit; and
   the control circuit obtains a duration of time from inversion to re-inversion of voltage detection signal (HL) of the contact point as the period (tm).

6. The energy storage device according to claim 1,
   wherein a first voltage detection signal (HL1) output from the first comparator and a second voltage detection signal (HL2) output from the second comparator are independently input to the control circuit; and
   the control circuit obtains a duration of time from inversion of the first voltage detection signal (HL1) to inversion of the second voltage detection signal (HL2) as the period (tm).

7. The energy storage device according to claim 1, further comprising a temperature sensor electrically coupled to the control circuit, the temperature sensor capable of measuring a temperature of the energy storage section;
   wherein the control circuit corrects the capacitance (C) based on correlation between a temperature (T) detected by the temperature sensor and the capacitance (C).

8. The energy storage device according to claim 1, wherein the control circuit stops an operation for calculating the capacitance (C) if charging of the energy storage section is interrupted while calculating the capacitance (C).

* * * * *